United States Patent
Schaper et al.

(10) Patent No.: US 12,153,862 B2
(45) Date of Patent: Nov. 26, 2024

(54) METHOD AND SYSTEM FOR PROCESSING VEHICLE TEST DATA OF A VEHICLE

(71) Applicant: Dr. Ing. h.c. F. Porsche Aktiengesellschaft, Stuttgart (DE)

(72) Inventors: Joachim Schaper, Heusenstamm (DE); Daniel Schumacher, Stuttgart (DE); Martin Braun, Neustetten-Wolfenhausen (DE); Alexandra Terhesiu, Zalau (RO)

(73) Assignee: Dr. Ing. h.c. F. Porsche Aktiengesellschaft (DE)

( * ) Notice: Subject to any disclaimer, the term of this patent is extended or adjusted under 35 U.S.C. 154(b) by 797 days.

(21) Appl. No.: 17/340,205

(22) Filed: Jun. 7, 2021

(65) Prior Publication Data

US 2021/0383043 A1 Dec. 9, 2021

(30) Foreign Application Priority Data

Jun. 8, 2020 (DE) ...................... 10 2020 115 186.1

(51) Int. Cl.
*G06F 30/27* (2020.01)
*G06N 3/08* (2023.01)
*G07C 5/00* (2006.01)

(52) U.S. Cl.
CPC .............. *G06F 30/27* (2020.01); *G06N 3/08* (2013.01); *G07C 5/008* (2013.01)

(58) Field of Classification Search
CPC ........... G06F 30/27; G06F 30/20; G06N 3/08; G07C 5/008
See application file for complete search history.

(56) References Cited

U.S. PATENT DOCUMENTS

2014/0380264 A1* 12/2014 Misra ...................... H04L 67/10
717/100
2019/0064787 A1* 2/2019 Maturana ........... G05B 23/0227

FOREIGN PATENT DOCUMENTS

DE 102013203943 A1 9/2014

OTHER PUBLICATIONS

A. Fedowsi, U. Challita, W. Saad, âDeep Learning for Reliable Mobile Edge Analytics in Intelligent Transportation Systemsâ pp. 1-7, (Year: 2017).*

(Continued)

*Primary Examiner* — Kibrom K Gebresilassie
(74) *Attorney, Agent, or Firm* — Buchanan Ingersoll & Rooney PC

(57) ABSTRACT

A method for processing vehicle test data of a vehicle, in which a cloud-based storage and computing device that is communicatively connected to the vehicle via a data network is provided with a multiplicity of modelling vehicle test data that are provided by a plurality of control devices and/or sensor devices of the vehicle. The cloud-based storage and computing device analyzes the received modelling vehicle test data and takes these modelling vehicle test data as a basis for generating test-case-specific edge analytics algorithms in an automated manner and transmits the algorithms to an edge analytics computing device inside the vehicle via the data network. The edge analytics computing device receives a multiplicity of vehicle test data from the control devices and/or the sensor devices during the performance of test or trial drives by the vehicle and evaluates the data by way of the edge analytics algorithms.

9 Claims, 1 Drawing Sheet

(56) References Cited

OTHER PUBLICATIONS

F. Morano, C. Ferretti, A. Leporati, P. Napoletano, R. Schettini, âA blockchain technology for protection and probative value preservation of vehicle driver dataâ, pp. 167-172, IEEE (Year: 2019).*
Sicking et al., "Whitepaper—Machine Learning 'On the Edge'," https://www.iais.fraunhofer.de/content/dam/iais/pr/pi/2019/WhitepaperMachineLearningontheedge/Whitepaper_Machine-Learning-on-the-edge_FraunhoferIAIS.pdf, 2019, with English translation, 12 pages.

* cited by examiner

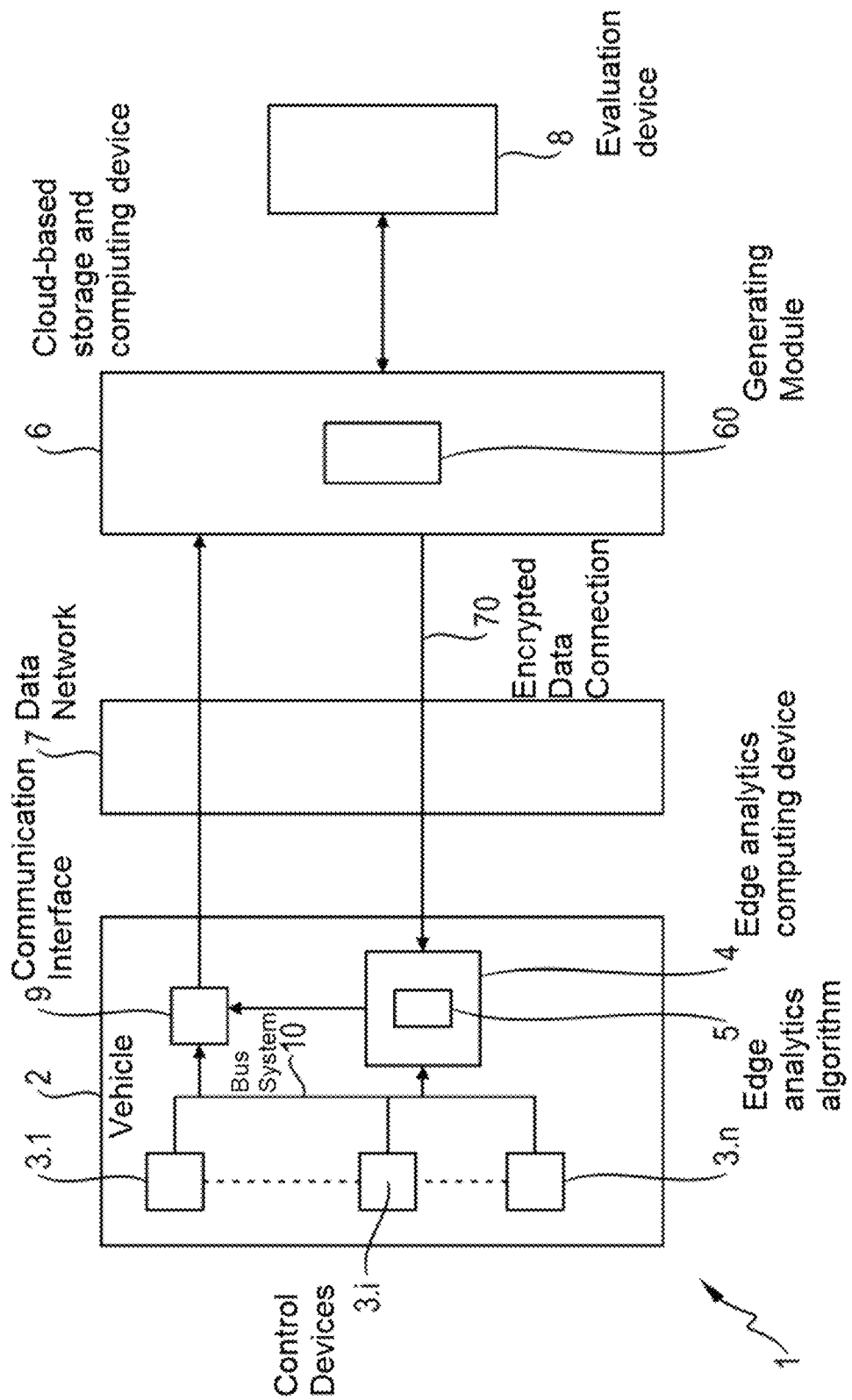

METHOD AND SYSTEM FOR PROCESSING VEHICLE TEST DATA OF A VEHICLE

CROSS-REFERENCE TO RELATED APPLICATION

This application claims priority to German Patent Application No. 10 2020 115 186.1, filed Jun. 8, 2020, the content of such application being incorporated by reference herein in its entirety.

FIELD OF THE INVENTION

The present invention relates to a method and a system for processing vehicle test data of a vehicle.

BACKGROUND OF THE INVENTION

During the development phase of vehicles, in particular of motor vehicles, very large volumes of data are generated that need to be processed in a suitable manner. This refers to vehicle test data generated during test or trial drives by the vehicle, data of so-called HiL tests (HiL="Hardware in the Loop"), in which the vehicle is simulated by a modelling in order to test control functions of one or more electronic control devices in real time, or simulation data of complex vehicle simulation models. In this context, it has been shown that in particular the vehicle test data generated during test or trial drives are fragmented to a high degree, which means that evaluation thereof is a very time-consuming and computation-intensive process.

A vehicle usually has a plurality of electronic control devices in order to control operation of the vehicle and in order, furthermore, to monitor operation of the vehicle by receiving and processing appropriate sensor signals from a plurality of sensor means. A control device for controlling an internal combustion engine of a vehicle is configured for example such that it can control the injected amount of a fuel/air mixture and the injection time, among other things, on the basis of specific input parameters. The control devices of a vehicle are normally networked to one another via a vehicle bus system, which can be a CAN bus system or a FlexRay bus system, for example, and are therefore communicatively connected to one another, as a result of which a data interchange can take place between the individual control devices. Since the control devices perform very specific control and monitoring functions, they are not usually designed to perform complex computing operations, as are required for evaluating vehicle test data. Accordingly, the control devices frequently also have no especially powerful processors and large main memories, since a fundamental aspect during the development of control devices is the long life and reliability thereof. A further stated aim for the development of control devices is to implement them as inexpensively as possible.

DE 10 2013 203 943 A1, which is incorporated herein by reference, discloses a system for processing vehicle data in which the data of a plurality of control devices of a vehicle are provided to a cloud-based storage and computing device. The control devices of the vehicle, in particular in view of their processor powers and the size of their main memory, are unable to evaluate correspondingly large volumes of data. The cloud-based storage and computing device can be used to evaluate the vehicle data with the aid of neural networks, for example. This provides the opportunity for decentralized evaluation of the vehicle data communicated to the cloud-based storage and computing device.

SUMMARY OF THE INVENTION

Described herein is a method and a system for processing vehicle test data of a vehicle that allows simple and resource-saving evaluation of a large number of vehicle test data generated during test or trial drives by the vehicle.

In the case of a method according to aspects of the invention for processing vehicle test data, there is provision for a cloud-based storage and computing device that is communicatively connected to the vehicle via a data network to be provided with a multiplicity of modelling vehicle test data that are provided by a plurality of control devices and/or sensor means of the vehicle, wherein the cloud-based storage and computing device analyzes the received modelling vehicle test data and takes these modelling vehicle test data as a basis for generating test-case-specific edge analytics algorithms in an automated manner and transmits said algorithms to an edge analytics computing device inside the vehicle via the data network, as a result of which the edge analytics algorithms are stored in the edge analytics computing device, and wherein the edge analytics computing device receives a multiplicity of vehicle test data from the control devices and/or the sensor means during the performance of test or trial drives by the vehicle and evaluates said data by means of the edge analytics algorithms. In the case of the method according to aspects of the invention, the modelling and generation of the edge analytics algorithms therefore takes place in a decentralized manner in the cloud-based storage and computing device, whereas the evaluation of the vehicle test data during the trial or test mode of the vehicle is performed directly in the vehicle by means of the edge analytics computing device. In this context, the term "edge analytics" means that the analysis of the vehicle test data takes place directly and centrally in the vehicle—that is to say at the edge of the data network—and not in the cloud-based storage and computing device. This measure means that it is therefore advantageously not necessary to continually transmit vehicle test data to the cloud-based storage and computing device for evaluation purposes during the trial or test mode of the vehicle, as a result of which in particular network resources can be saved. Preferably, only the results of the evaluation of the vehicle test data and not the vehicle test data in the form of raw data are transmitted via the data network from the vehicle to the cloud-based storage and computing device, in which they can be stored in a retrievable manner. This advantageously allows memory space to be saved.

In an advantageous embodiment, it is proposed that the edge analytics algorithms be implemented as artificial neural networks for supervised learning or unsupervised learning or reinforcement learning. If the edge analytics algorithms are implemented as artificial neural networks for reinforcement learning, methods are used that allow naturally dynamic software agents to independently learn strategies for attaining the highest possible rewards.

In a particularly advantageous embodiment, there is the possibility of the edge analytics algorithms being implemented as deep learning algorithms.

To increase security and to protect against attacks and manipulations, it is proposed in a preferred embodiment that the edge analytics algorithms be transmitted from the cloud-based storage and computing device via the data network to the edge analytics computing device by means of an encrypted data connection.

A system according to aspects of the invention for processing vehicle test data of a vehicle comprises:

a cloud-based storage and computing device that is communicatively connected to the vehicle via a data network and that is configured to receive a multiplicity of modelling vehicle test data that are provided by a plurality of control devices and/or sensor means of the vehicle, wherein the cloud-based storage and computing device has a generating module for generating edge analytics algorithms in an automated manner, which is configured to analyze the received modelling vehicle test data and to take these modelling vehicle test data as a basis for generating test-case-specific edge analytics algorithms in an automated manner, and an edge analytics computing device that is arranged inside the vehicle and that is configured to receive and store the edge analytics algorithms from the cloud-based storage and computing device via the data network, wherein the edge analytics computing device is further configured to receive a multiplicity of vehicle test data that are provided by the control devices and/or the sensor means during the performance of test or trial drives by the vehicle and to evaluate said data by means of the edge analytics algorithms stored in the edge analytics computing device. The system according to aspects of the invention is suitable in particular for performing the method explained above, which means that it is possible to refer at this juncture to the advantages already cited above. In order to be able to execute the edge analytics algorithms during the test or trial drives by the vehicle and hence to be able to evaluate the vehicle test data centrally in the vehicle, the edge analytics computing device needs to be of more powerful design, in particular in regard to its processor power and its main memory, than the control devices installed in the vehicle.

In an advantageous embodiment, it is proposed that the edge analytics algorithms be implemented as artificial neural networks for supervised or unsupervised learning or reinforcement learning.

In a particularly advantageous embodiment, there can be provision for the edge analytics algorithms to be implemented as deep learning algorithms.

In a preferred embodiment, there is the possibility of the system having an encrypted data connection between the cloud-based storage and computing device and the edge analytics computing device. This encrypted data connection can be used to transmit in particular the edge analytics algorithms generated by the cloud-based storage and computing device to the edge analytics computing device.

Preferably, the system can have an evaluation device that is communicatively connected to the cloud-based storage and computing device and that is configured to receive the vehicle test data evaluated by the edge analytics computing device during the trial or test drives and the edge analytics algorithms generated by the generating module and also information concerning the models on which said algorithms are based from the cloud-based storage and computing device, as a result of which these can be checked, processed and possibly subjected to further evaluation, for example, by a test engineer.

Essential advantages of the system presented here and of the method according to aspects of the invention are for example faster test cycles, which also lead to shorter development cycles during vehicle development. Furthermore, data validation during operation of the vehicle is possible, as a result of which fewer trial or test drives are necessary than hitherto. In particular, it is possible to improve the data logging and the creation of error reports during the performance of trial or test drives.

In addition, it is a simple matter for vehicle innovation platforms to be provided in order to implement and test new vehicle functions that can be improved by artificial intelligence methods. Particular mention should be made in this context of functions of driver assistance systems, such as for example functions of an adaptive speed control of the vehicle.

BRIEF DESCRIPTION OF THE DRAWINGS

The sole FIGURE shows a system for processing vehicle test data of a vehicle in schematically highly simplified form.

DETAILED DESCRIPTION OF THE INVENTION

Further features and advantages of the present invention become clear from the description of a preferred exemplary embodiment below with reference to the accompanying FIGURE, which shows a system 1 for processing vehicle test data of a vehicle 2 in schematically highly simplified form.

In a manner known per se, the vehicle 2 has a plurality of control devices 3.1 . . . 3.$n$ that are communicatively connected to one another via a bus system 10, in particular via a CAN bus system or a FlexRay bus system, and that are configured to control and monitor the operation of the vehicle 2. The control devices 3.1 . . . 3.$n$, or a plurality of sensor means interacting therewith, which are not depicted explicitly in the FIGURE for simplification reasons, generate a multiplicity of vehicle test data during the performance of trial or test drives by the vehicle 2 as part of the vehicle development, which data need to be evaluated in a suitable manner. These very computation-intensive evaluations of the vehicle test data cannot be performed by the control devices 3.1 . . . 3.$n$ themselves, since, in particular bearing in mind their processor powers and the size of their main memories, they are not designed for such computation processes.

The system 1 therefore has an edge analytics computing device 4 that is arranged inside the vehicle 2 and that is configured to receive the vehicle test data generated during the trial or test drives by the vehicle 2, which data are provided by the control devices 3.1 . . . 3.$n$ and possibly also directly by the sensor means, and to evaluate said data using one or more edge analytics algorithms 5 implemented in the edge analytics computing device 4. Furthermore, the system 1 has, outside the vehicle 2, a decentralized, cloud-based storage and computing device 6 that is communicatively connected to the vehicle 2 via a data network 7, which can be in particular a public data network, such as for example the Internet. Preferably, the data network 7 is a wireless data network, in particular a wireless local area network (wireless LAN, WLAN for short) or a telecommunication network. The system 1 has at least one appropriate communication interface 9 that allows a data transmission between the vehicle 2 and the cloud-based storage and computing device 6 via the data network 7.

In this context, the term "edge analytics" signifies that the analysis of the vehicle test data takes place directly and centrally in the vehicle 2—that is to say at the edge of the data network 7—and not in the cloud-based storage and computing device 6. Unlike in the case of cloud-based approaches to a solution, the vehicle test data are therefore collected and evaluated at the location at which they actually arise. However, this also means that the edge analytics computing device 4 needs to be in much more powerful form, in regard to its processor power and memory size, than for example the individual control devices 3.1 . . . 3.n of the vehicle 2, which in this respect, and not least for reasons of cost, are of correspondingly less powerful design.

The edge analytics algorithms 5 executed by the edge analytics computing device 4 are based on artificial intelligence methods and models and can be implemented in particular by different architectures of artificial neural networks for supervised learning or unsupervised learning or reinforcement learning, in particular as deep learning algorithms.

The cloud-based storage and computing device 6 is used to generate the applicable edge analytics algorithms 5 before the actual performance of test or trial drives. For this purpose, a generating module 60 for generating edge analytics algorithms 5 in an automated manner is implemented in the cloud-based storage and computing device 6. Which edge analytics algorithms 5 are generated by the generating module 60 in an automated manner is specifically dependent on the respective test case. The applicable training data and validation data for generating and training the edge analytics algorithms 5 are therefore test case specific and are provided by the control devices 3.1 . . . 3.n and possibly the further sensor means of the vehicle 2 as modelling vehicle test data and transmitted to the cloud-based storage and computing device 6 via the data network 7 and processed by the generating module 60. The edge analytics algorithms 5 generated by the generating module 60 are transmitted, following the automatic generation, from the cloud-based storage and computing device 6 to the edge analytics computing device 4 of the vehicle 2 via an encrypted data connection 70 of the data network 7 and stored in said computing device in an executable manner. The edge analytics computing device 4 is therefore capable of executing the edge analytics algorithms 5 and therefore of evaluating the vehicle test data generated during the trial or test drive directly inside the vehicle 2. The results of these evaluations by the edge analytics computing device 4 can be transmitted to the cloud-based storage and computing device 6 via the data network 7. In the cloud-based storage and computing device 6, these results can be stored in a retrievable manner and possibly even conditioned and/or subjected to further processing.

An advantage of the system 1 described here is that the evaluation of the vehicle test data by means of the edge analytics computing device 4 takes place directly in the vehicle, which means that it is not necessary for these vehicle test data, in particular in the form of raw data, to be transmitted to the cloud-based storage and computing device 6 for evaluation purposes. As a result, it is advantageously possible to save network resources.

The system 1 furthermore has an evaluation device 8 that is communicatively connected to the cloud-based storage and computing device 6 and that is configured to receive the vehicle test data evaluated by the edge analytics computing device 4 during the trial or test drives and the edge analytics algorithms 5 generated by the generating module 60 and also information concerning the models on which said algorithms are based from the cloud-based storage and computing device 6, as a result of which these can be checked, processed and possibly subjected to further evaluation, for example, by a test engineer.

The system 1 presented here advantageously allows the automated capture of vehicle test data, in particular log data, of a vehicle 2 and the analysis and evaluation of these vehicle test data using the edge analytics computing device 4 directly in the vehicle 2, as a result of which for example alarm signals or error messages can be generated during a test drive and/or the evaluated vehicle test data can be transmitted to the cloud-based storage and computing device 6.

The modelling vehicle test data transmitted to the cloud-based storage and computing device 6 are analyzed by the generating module 60 for generating edge analytics algorithms 5 in an automated manner and support the generation of new edge analytics algorithms 5 on the basis of the respective test case specification. It is therefore possible for new versions of the edge analytics algorithms 5 to be generated for the vehicle-based edge analytics computing device 4 in a simple manner and transmitted back to the edge analytics computing device 4 via the encrypted data connection 70 of the data network 7 so as thereby to support subsequent test or trial drives by the vehicle 2.

Essential advantages of the system 1 presented here and of the method performable thereby are for example faster test cycles, which lead to shorter development cycles during vehicle development. Furthermore, data validation during operation of the vehicle 2 is possible, as a result of which fewer trial or test drives are necessary than hitherto. In addition, it is also a simple matter for vehicle innovation platforms to be provided in order to implement and test new vehicle functions that can be improved by artificial intelligence methods. Particular mention should be made in this context of functions of driver assistance systems, such as for example the functions of an adaptive speed control.

What is claimed:

1. A method for processing vehicle test data of a vehicle, the method comprising:

communicatively connecting a cloud-based storage and computing device to the vehicle via a data network;

receiving, by the cloud-based storage and computing device, a multiplicity of modelling vehicle test data from control devices and/or sensor means of the vehicle, wherein the modelling vehicle test data is test-case-specific data simulated by a modelling in order to test control functions of one or more electronic control devices of the vehicle in real time;

analyzing the received modelling vehicle test data using the cloud-based storage and computing device and using the modelling vehicle test data as a basis for generating test-case-specific edge analytics algorithms in an automated manner;

transmitting said generated test-case-specific algorithms from the cloud-based storage and computing device to an edge analytics computing device inside of the vehicle via the data network, storing the generated test-case-specific edge analytics algorithms in the edge analytics computing device, receiving at the edge analytics computing device a multiplicity of vehicle test data collected from the control devices and/or the sensor means during the performance of test or trial drives by the vehicle; and evaluating the vehicle test data received at the edge analytics computing device using the edge analytics algorithms during the performance of test or trial drives by the vehicle directly in the vehicle to save network resources.

2. The method as claimed in claim 1, wherein the edge analytics algorithms are implemented as artificial neural networks for supervised learning or unsupervised learning or reinforcement learning.

3. The method as claimed in claim 2, wherein the edge analytics algorithms are implemented as deep learning algorithms.

4. The method as claimed in claim 1, wherein the edge analytics algorithms are transmitted from the cloud-based storage and computing device via the data network to the edge analytics computing device by way of an encrypted data connection.

5. A system for processing vehicle test data of a vehicle, the system comprising:
 a vehicle having a plurality of control devices and/or sensor means;
 (i) a cloud-based storage and computing device that is communicatively connected to the vehicle via a data network and that is configured to receive a multiplicity of modelling vehicle test data that are provided by the plurality of control devices and/or sensor means of the vehicle, wherein the modelling vehicle test data is test-case-specific data simulated by a modelling in order to test control functions of one or more electronic control devices of the vehicle in real time, wherein the cloud-based storage and computing device comprises a generating module for generating edge analytics algorithms in an automated manner, and wherein the cloud-based storage and computing device is configured to analyze the received modelling vehicle test data and to take the modelling vehicle test data into account for generating test-case-specific edge analytics algorithms in an automated manner, and
 (ii) an edge analytics computing device that is arranged inside of the vehicle and that is configured to receive and store the generated test-case-specific edge analytics algorithms from the cloud-based storage and computing device via the data network, receive a multiplicity of vehicle test data that are provided by the control devices and/or the sensor means during the performance of test or trial drives by the vehicle and to evaluate said vehicle test data using the edge analytics algorithms stored in the edge analytics computing device during the performance of test or trial drives by the vehicle directly in the vehicle to save network resources.

6. The system as claimed in claim 5, wherein the edge analytics algorithms are implemented as artificial neural networks for supervised learning or unsupervised learning or reinforcement learning.

7. The system as claimed in claim 6, wherein the edge analytics algorithms are implemented as deep learning algorithms.

8. The system as claimed in claim 5, wherein the system has an encrypted data connection between the cloud-based storage and computing device and the edge analytics computing device.

9. The system as claimed in claim 5, wherein the system further comprises an evaluation device that is communicatively connected to the cloud-based storage and computing device and that is configured to receive (i) the vehicle test data evaluated by the edge analytics computing device during the trial or test drives, (ii) the edge analytics algorithms generated by the generating module and (iii) information concerning models on which said algorithms are based from the cloud-based storage and computing device.

* * * * *